(12) United States Patent
Stam

(10) Patent No.: US 7,933,858 B2
(45) Date of Patent: Apr. 26, 2011

(54) GENERAL FRAMEWORK FOR GRAPHICAL SIMULATIONS

(75) Inventor: Jos Stam, Toronto (CA)

(73) Assignee: Autodesk, Inc., San Rafael, CA (US)

( * ) Notice: Subject to any disclaimer, the term of this patent is extended or adjusted under 35 U.S.C. 154(b) by 814 days.

(21) Appl. No.: 11/690,152

(22) Filed: Mar. 23, 2007

(65) Prior Publication Data

US 2008/0235171 A1 Sep. 25, 2008

(51) Int. Cl.
*G06F 15/00* (2006.01)

(52) U.S. Cl. .......... 706/62; 706/45; 706/46; 706/47; 703/2; 703/6; 703/7; 703/8; 703/9; 703/10; 703/11; 703/12

(58) Field of Classification Search .......... 706/11, 706/14, 45, 52, 60, 62; 703/2, 5–12
See application file for complete search history.

(56) References Cited

U.S. PATENT DOCUMENTS

| | | | |
|---|---|---|---|
| 6,141,019 A * | 10/2000 | Roseborough et al. ....... 345/473 |
| 6,243,663 B1 * | 6/2001 | Baty et al. .......... 703/2 |
| 6,657,629 B2 | 12/2003 | Baraff et al. |
| 7,091,977 B2 | 8/2006 | Jeong et al. |
| 7,403,202 B1 * | 7/2008 | Nash .......... 345/474 |
| 7,505,883 B2 * | 3/2009 | Leprevost .......... 703/2 |
| 7,526,456 B2 * | 4/2009 | Zhang et al. .......... 706/10 |
| 7,676,356 B2 * | 3/2010 | Carmel et al. .......... 703/21 |
| 2002/0123812 A1 * | 9/2002 | Jayaram et al. .......... 700/98 |
| 2002/0161562 A1 * | 10/2002 | Strunk et al. .......... 703/6 |
| 2004/0075662 A1 | 4/2004 | Baraff et al. |
| 2004/0193392 A1 * | 9/2004 | Williams et al. .......... 703/2 |
| 2005/0052461 A1 | 3/2005 | Vassilev et al. |
| 2005/0075154 A1 * | 4/2005 | Bordes et al. .......... 463/1 |
| 2005/0075849 A1 * | 4/2005 | Maher et al. .......... 703/2 |
| 2005/0165873 A1 * | 7/2005 | Zhang et al. .......... 708/446 |
| 2005/0165874 A1 * | 7/2005 | Zhang et al. .......... 708/446 |
| 2005/0187742 A1 * | 8/2005 | Collodi .......... 703/2 |
| 2006/0122819 A1 * | 6/2006 | Carmel et al. .......... 703/21 |
| 2006/0125830 A1 | 6/2006 | Piponi |
| 2006/0136138 A1 * | 6/2006 | Hicklin et al. .......... 702/19 |
| 2006/0149516 A1 * | 7/2006 | Bond et al. .......... 703/6 |
| 2006/0217945 A1 * | 9/2006 | Leprevost .......... 703/2 |
| 2006/0235659 A1 * | 10/2006 | Stam .......... 703/2 |
| 2006/0262113 A1 * | 11/2006 | Leprevost .......... 345/419 |
| 2007/0129916 A1 * | 6/2007 | Muller et al. .......... 703/2 |
| 2008/0021679 A1 * | 1/2008 | Bleiweiss et al. .......... 703/2 |
| 2008/0133189 A1 * | 6/2008 | Criswell et al. .......... 703/6 |
| 2009/0228244 A1 * | 9/2009 | Naudet et al. .......... 703/2 |

OTHER PUBLICATIONS

Neal, K., Collision Approximation for Real-Time Cloth Simulation, ACM SIGGRAPH 2004 Posters, Aug. 2004, p. 1.

Wong, et al., "Multi-Layered Deformable Surfaces for Virtual Clothing," Proceedings of the ACM Symposium on Virtual Reality Software and Technology, Nov. 2004, pp. 24-31.

(Continued)

*Primary Examiner* — Omar F Fernandez Rivas
(74) *Attorney, Agent, or Firm* — Staas & Halsey LLP

(57) ABSTRACT

A system is described that treats a solver as an ordered sequence of steps involving the different objects that have to be simulated and relationships between them. Tasks and the order of the tasks are obtained from each object and relationship. The tasks are merged into a sorted list. The solver traverses the list and passing each task to a corresponding object and relationship where the objects are interleaved during processing. The object or relationship then executes the task.

2 Claims, 4 Drawing Sheets

OTHER PUBLICATIONS

Chittaro, et al., "3D Virtual Clothing: from Garment Design to Web3D Visualization and Simulation", Proceedings of the $8^{th}$ Int. Conf. on 3D Web Technology, Mar. 2003, pp. 73-84, 204.

Bridson et al., "Simulation of Clothing with Folds and Wrinkles", Proceedings of the 2003 ACM SIGGRAPH/Eurographics Symposium on Computer Animation, Jul. 2003, pp. 28-36.

Baraff, et al., "Untangling Cloth, ACM Transactions on Graphics", ACM SIGGRAPH 2003 Papers, Jul. 2003, pp. 862-870.

U.S. Appl. No. 11/104,607, filed Apr. 13, 2005, Jos Stam, Autodesk, Inc.

Office Action issued Feb. 3, 2010 in U.S. Appl. No. 11/104,607.
Office Action issued Aug. 14, 2009 in U.S. Appl. No. 11/104,607.
Notice of Withdrawal from Issue Under 37 CFR 1.313(b) mailed May 11, 2009 in U.S. Appl. No. 11/104,607.
Notice of Allowance and Fee(s) Due mailed Dec. 16, 2008 in U.S. Appl. No. 11/104,607.
Office Action mailed Jul. 10, 2008 in U. S. Appl. No. 11/104,607.
Office Action mailed Sep. 24, 2007 in U.S. Appl. No. 11/104,607.
Piponi, U.S. Appl. 60/584,805, filed Jun. 30, 2004.
Notice of Allowance and Issue Fee Transmittal issued in co-pending U.S. Appl. No. 11/104,607 dated Jun. 25, 2010.

* cited by examiner

300

GENERAL FRAMEWORK FOR GRAPHICAL SIMULATIONS

BACKGROUND

1. Field

The embodiments discussed herein are directed to a system that considers a solver as a sequence of steps involving "objects" and their "relations."

2. Description of the Related Art

This discussion describes a framework for an implementation of a graphical dynamics simulator ("solver"). In computer graphics there is a need to simulate the motion of interacting objects over time. For example, in games virtual characters respond to collisions with surrounding objects and external forces. Usually a solver is hard coded for a fixed number of objects and their possible interactions. Adding new types of objects and tweaking their interactions requires that the internal logic of the solver be modified directly. This makes it often hard to expand or modify the solver. This is especially problematic when a third party wants to modify the solver in some way or other. In general, the third party does not have access to the source code of the solver and therefore cannot modify the solver directly. In fact this situation is quite common in the special effects film industry. No solver will exactly meet the expectations of a production house. Often the output of the simulation is tweaked to achieve a certain effect. It would be much more convenient if animators could directly control the logic of the simulation and modify it. It is also important that all interactions are computed in a single solver. Frequently, animators use a variety of solvers for different effects such as rigid body motion, hair movement, pouring liquids or modeling cloth. The problem is that one solver always takes precedence over the others which introduces unwanted biases. Also problematic is the handling of two way interaction between phenomena, like a rigid soccer ball being kicked into a net, this requires that the rigid body solver be connected to the cloth solver for the net. Having a single general solver that allows many different objects to interact resolves this problem.

SUMMARY

It is an aspect of the embodiments discussed herein to provide a solver that is not hard coded for a fixed number of objects and their possible interactions, but is general and flexible.

It is also an aspect of the embodiments discussed herein to allow animators to directly control the logic of a simulation and modify it.

It is a further aspect of the embodiments discussed herein to provide a solver that makes no assumption about the type of objects that are being simulated and allows new objects to be added.

It is a further aspect of the embodiments discussed herein to provide a single solver that allows proper interactions between different types of objects through an interleaving process.

The above aspects can be attained by a system that treats a solver as an ordered sequence of steps involving the different objects that have to be simulated and relationships between them. The solver first queries each object and relationship for the number of tasks they have to perform and their order. The solver merges these ordered tasks into a sorted list. A single time step of the solver involves a traversal of the sorted list and passing each task to a corresponding object and relationship. The object or relationship executes a task based on the order number.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE EMBODIMENTS

Figure 1:
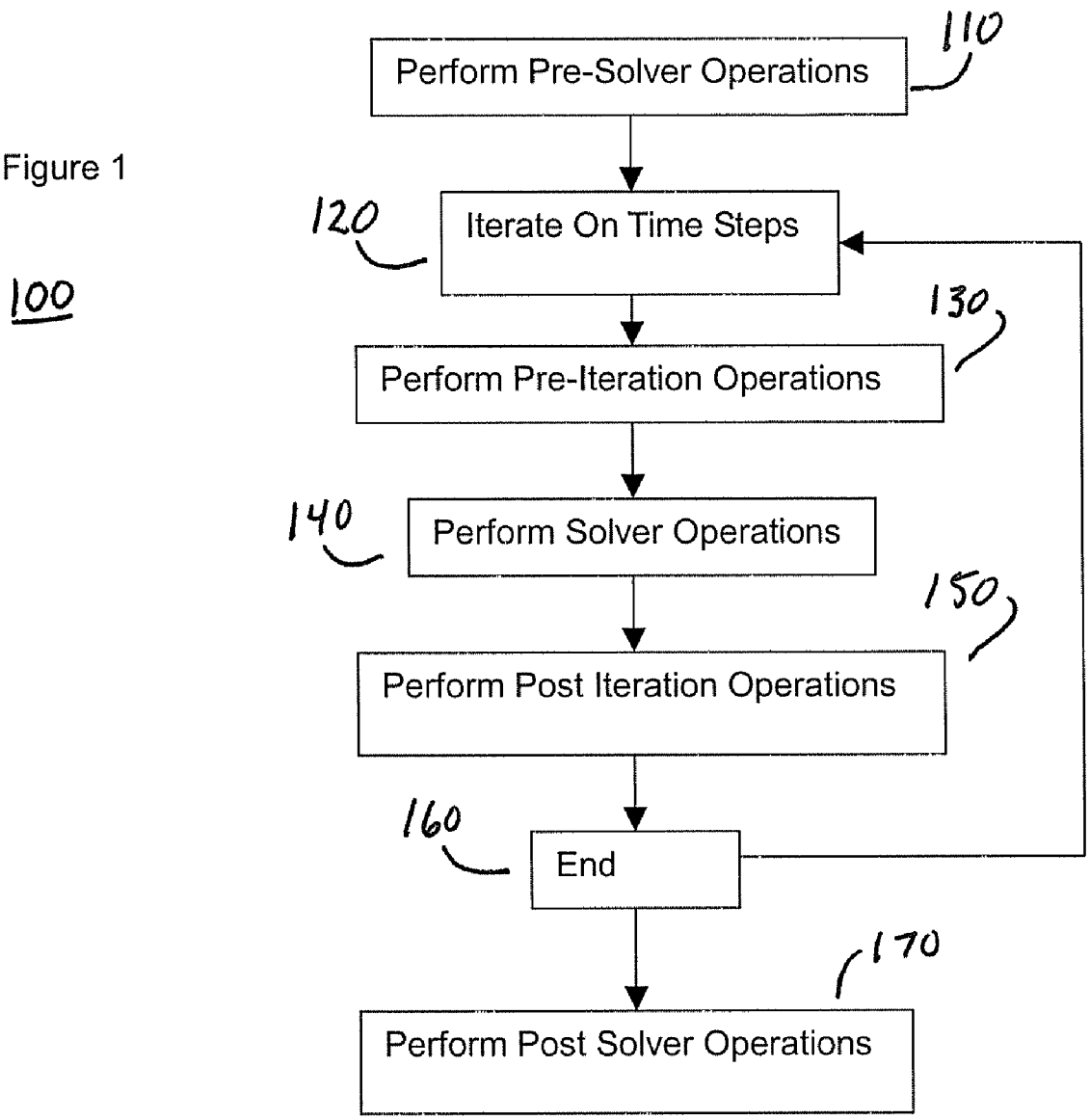
FIG. 1 depicts operations of a solver.

The discussion herein provides a solution to the problem discussed above. In general it is impossible to predict exactly all possible types of objects and interactions in advance. Also the quality of solvers evolves over time sometimes requiring drastic changes to the solver itself. So, having a general and flexible solver is desirable. The basic idea the technique discussed herein is to abstract the process of a solver into a sequence of steps involving "objects" and their "relations." The solver has no knowledge of what these objects and relations are or do. It only schedules when they are to do something. Below this is described in more detail.

The discussion will start with a general example. Consider a cloth solver. Over a single time step the operation usually includes the following steps:

01: Add external wind force to the cloth
02: Add external gravity force to the cloth
03: Update spatial data structures of the cloth
04: Update spatial data structures of the collision object
05: Compute potential collision pairs between the cloth and itself
06: Compute potential collision pairs between the cloth and the collision object
07: Resolve self-collisions of the cloth
08: Collide triangles
09: Update velocities of the cloth
10: Update velocities of the object
11: Handle stretching of the cloth
12: Handle bending of the cloth
13: Update positions of the cloth
14: Update positions of the collision objects This can be abstracted by saying that a cloth solver is a sequence of steps involving the following "objects": cloth, collision object, stretch constraint, bending constraint, wind force and gravity forces. The relations between these objects are: collision, apply force, stretching and bending. In terms of these objects and relations the solver steps can be rewritten as follows:

01: ApplyForce (WindForce, Cloth)
02: ApplyForce (Gravity, Cloth)
03: Cloth.UpdateSpatialData( )
04: Object.UpdateSpatialData( )
05: Collision (Cloth, Cloth).BuildPairs( )
06: Collision (Cloth, Object).BuildPairs( )
07: Collision (Cloth, Cloth).Resolve( )
08: Collision (Cloth, Object).Resolve( )
09: Cloth.UpdateVelocities( )

10: Object.UpdateVelocities( )
11: Stretch (Cloth)
12: Bending (Cloth)
13: Cloth.UpdatePositions( )
14: Object.UpdatePositions( )

This shows that each object or relation has to do a specific task at a given point in this sequence. For example, the cloth has to perform the following three tasks:

03: Cloth.UpdateSpatialData( )
09: Cloth.UpdateVelocities( )
13: Cloth.UpdatePositions( )
Or
Cloth: 03, 09, 13.
Similarly
Object: 04, 10, 14
Collision (Cloth, Cloth): 05, 07
Collision (Cloth, Object): 06, 08
ApplyForce (Wind, Cloth): 01
ApplyForce (Gravity, Cloth): 02
Stretch (Cloth): 11
Bend (Cloth): 12

From this it can be seen that a solver is a list of objects and relations with some order in which they are active and perform some action. At first the solver queries each object and asks how many steps it has and when they should be performed. For example, cloth would respond: I have 3 steps and their order is {03,09,13}. Then, the solver merges all the data into a single list. It might happen that some objects have equal orders. This just means that their order of execution is irrelevant. When solving, the solver calls each object in turn with the current order number. It is then up to the object to perform whatever task based on this order number. For example, for a cloth this would look like:

Solve (OrderId)
if OrderId=03 then UpdateSpatialData( )
if OrderId=09 then UpdateVelocities( )
if OrderId=13 then UpdatePositions( )
End Say the order numbers are stored in an list OrderId[ ], then the execution of one time step of the solver is as follows:

```
for i=1 to number of order ids do
    for k=1 to number of objects (including relations)
        object[k].Solve (OrderId[i] )
    end
end
```

The ordering shown above, of course, does not need to be fixed. The order numbers can be potentially be assigned from outside of the object. Also they need not be consecutive as in the example. For example, what if a production house needs to insert an ImproveCollisions( ) after step 08. Then you can simply multiply all order numbers by 10. So, now a new object MyCollision can be added to the solver with one number id equal to 85:

80: Collision (Cloth, Object).Resolve( )
85: MyCollision.ImproveCollisions( )
90: Cloth.UpdateVelocities( )

As noted above, in computer graphics there is a need to convincingly simulate the behavior of physical phenomena such as falling bodies, splashing liquids or deforming cloth. Usually their behavior is simulated using a solver based on physical principles. A solver takes a description of the objects and then computes a new state based on the current velocities and forces acting on the system. Such solvers are a key in creating realistic shots in the special effects industry and enhance the plausibility of an interactive video game. Traditionally solvers have been fine tuned for specific phenomena. For example, a lot of research has been invested in creating rigid body solvers, fluid flow solvers or cloth solvers. This results in an array of solvers for each specific phenomenon. In many cases this makes it hard to model interactions between different elements such as pouring water on a piece of cloth. This discussion introduces a model that includes a single solver. The solver makes no assumption about the type of objects that are being simulated. The system also allows new objects to be added to the current solver. This is important since very often the users of the solver, such as technical directors in production houses, may wish to add their own code to the solver to create certain effects or replace components of the solver. For example, the user might have a better rigid body solver and may wish to replace the one offered in the standard solver.

The basic idea behind the present solution is that a solver is really just an ordered sequence of steps involving the different objects that have to be simulated and some relationships between them. The solver first queries each object and relationship for the number of tasks they have to perform and their order given by a number, which is called an order number. Next the solver merges these order numbers in a sorted list. A single step of the solver involves a traversal of the order numbers and passing them to each object and relationship. The object or relationship then decides to execute a task based on the order number.

Objects and especially relationships try to maintain certain constraints. For example, a stretch relationship tries to minimize the amount of elongation in cloth. Another example is a collision relationship between objects where the relation tries to minimize the amount of overlap between the objects. Since these constraints often affect each other they have to be satisfied in an iterative manner. The solver has a general iteration scheme in which each relation is asked to call the tasks that try to satisfy their constraints. Each relation specifies how many iterations it will perform. Herein is presented a method that interleaves the calls to the object within the iteration loop so that each object performs the required number of iterations.

This approach separates the elements of a simulation into two classes: objects and relations. Examples of objects are external forces, particles, cloth or rigid bodies. Relations model relationships between these objects. Examples of relations are collisions between a cloth and a rigid body or applying a force to a particle system. However, the system treats both objects and relations as "objects" since they are conceptually identical from the point of view of the solver. Therefore, in the rest of the discussion object often refers to both objects and relations. As depicted in FIG. 1, the solver 100 can be composed of the following operations:

```
1:     pre_solve( )
for each time step
    2:     pre_iterations( )
    3:     solve( )
    4:     post_iterations( )
end
5:     post_solve ( )
```

Operations 1 and 5 (reference numbers 110 & 170) are only called at the very beginning and at the end of the simulation. Operations 2, 3 and 4 (reference numbers 130, 140 & 150) are called for each step of the simulation. Operation 3 (reference number 140) is comprised of an iterative loop in which objects try to satisfy their constraints. The iterations are needed since in general a simulation is a self-affecting system. A collision might induce a lot of stretching in the cloth, while the resolution of stretch might introduce penetration between objects.

Each object has tasks it has to perform in each of the 5 operations of the solver and these tasks have to be performed in a certain order. This is provided by having each object assign an order number to each of its tasks. At the beginning of the simulation the solver asks each object for its list of order numbers for each of the five steps of the simulation. This is better explained with an example. Assume there are three types of objects A, B and C and that they are only active in step 3 of the solver. A has two tasks f1( ) and f2( ), B has three tasks g1( ), g2( ) and g3( ) while C has one task h1( ). Assume that the tasks have to be executed in the following order: f1( ), g1( ), f2( ), h1( ), g2( ), g3( ). To achieve this object A defines its order numbers to be {10,30}, B's order numbers are {20,50, 60} and C's is just {40}. The solver merges these lists into a single ordered list of numbers {10,20,30,40,50,60}. The solver at solve time then calls each object for each number in the list. The object then checks if the order number matches one of its order numbers. If yes, it calls the appropriate task.

This procedure is made more precise by introducing the following notation. Let object[ ] be an array of all the objects that are active in the simulation and let order[ ] be the array that holds the merged order numbers. The simplest implementation of an algorithm that achieves the desired behavior of the tasks being executed in order is as follows:

```
for i=0 to number of order numbers – 1 do
    for k=0 to number of objects – 1 do
        object[k].do_task(step,order[i])
    end
end
```

Figure 2:
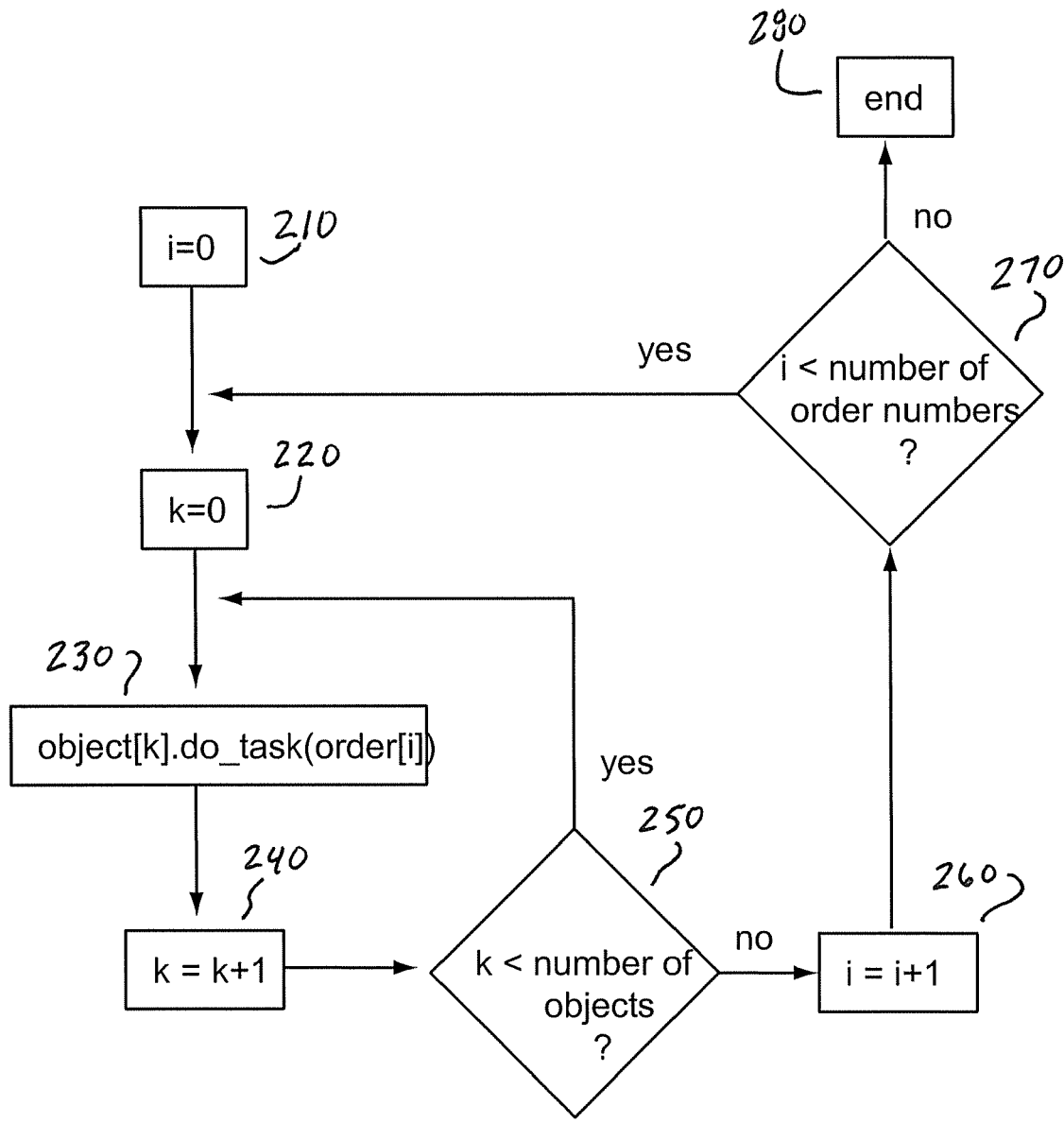
FIG. 2 depicts a process used to execute tasks in the correct order.

The corresponding flowchart 200 for this algorithm is provided in FIG. 2. After setting pointers 210 and 220, each object has a routine 230 called do_task(step,n) which checks if it has a task with order number n that has to be executed. If yes, it will execute the given task. In the example, object A would implement this function as follows:

```
do_task (step, n)
    if step = 3 then
        if n = 10 do task f1( )
        if n = 30 do task f2( )
    end
end
```

After the task is performed, pointers are updated 240 and 260 and corresponding checks 250 and 270 are performed to see if the end 280 of the objects and order numbers has been reached.

The variable "step" is a value between 1 and 5 and indicates which step of the solver is being executed. This framework also allows arbitrary objects to be added to the solver and have them execute tasks at any point in the solver. For example, you can create an object D with a single task k1( ) that has to be executed between f2( ) and h1( ). For this D has an order list of {35} and a do_task(step,n) function that executes k1( ) when its input is 35.

This is not the only manner to achieve the generality that our framework offers. Alternatively the solver could build a linked list of pointers to objects and the corresponding order number. Then, the procedure would be:

```
for each element e in the list
    e.object.do_task(order[e.order])
end
```

However, this would require a list to be precomputed.

Operation 3 of the solver is where each object tries to satisfy constraints. Rarely can the constraints be satisfied all at once in one step. Typically a solver iteratively tries to achieve a solution. This is the approach taken in this discussion. Each object has a maximum number of iteration steps n_max_it it is willing to perform. The solver should call the do_task(3,n) function n_max_it times for that object. A simple solution would be to simply have the object iterate that many times internally over its constraint satisfying code. However, this would give too much importance to the objects which have high order numbers since they will be called last. A better solution is to interleave the calls to the objects. If all the objects have the same maximum number of iteration then this is would be easy to achieve by simply adding a for loop of size n_max_it in step 3. In general, you want to iterate more over certain constraints than others. For a very stretchy cloth-like material the user might care more about the collisions being correct then the stretch being matched exactly. Therefore, you cannot assume that the maximum number of iterations for each object is the same.

The following interleaving scheme is provided to resolve these problems. First, the solver computes the largest of the n_max_it variables of the objects. This number is called n_max_it_max. Again to minimize the effect of one constraint over the others it is desired that all object get called at the last iteration step. For each object you first divide n_max_it_max by n_max_it:

$$n\_max\_it\_max = step * n\_max\_it + r$$

Figure 3:
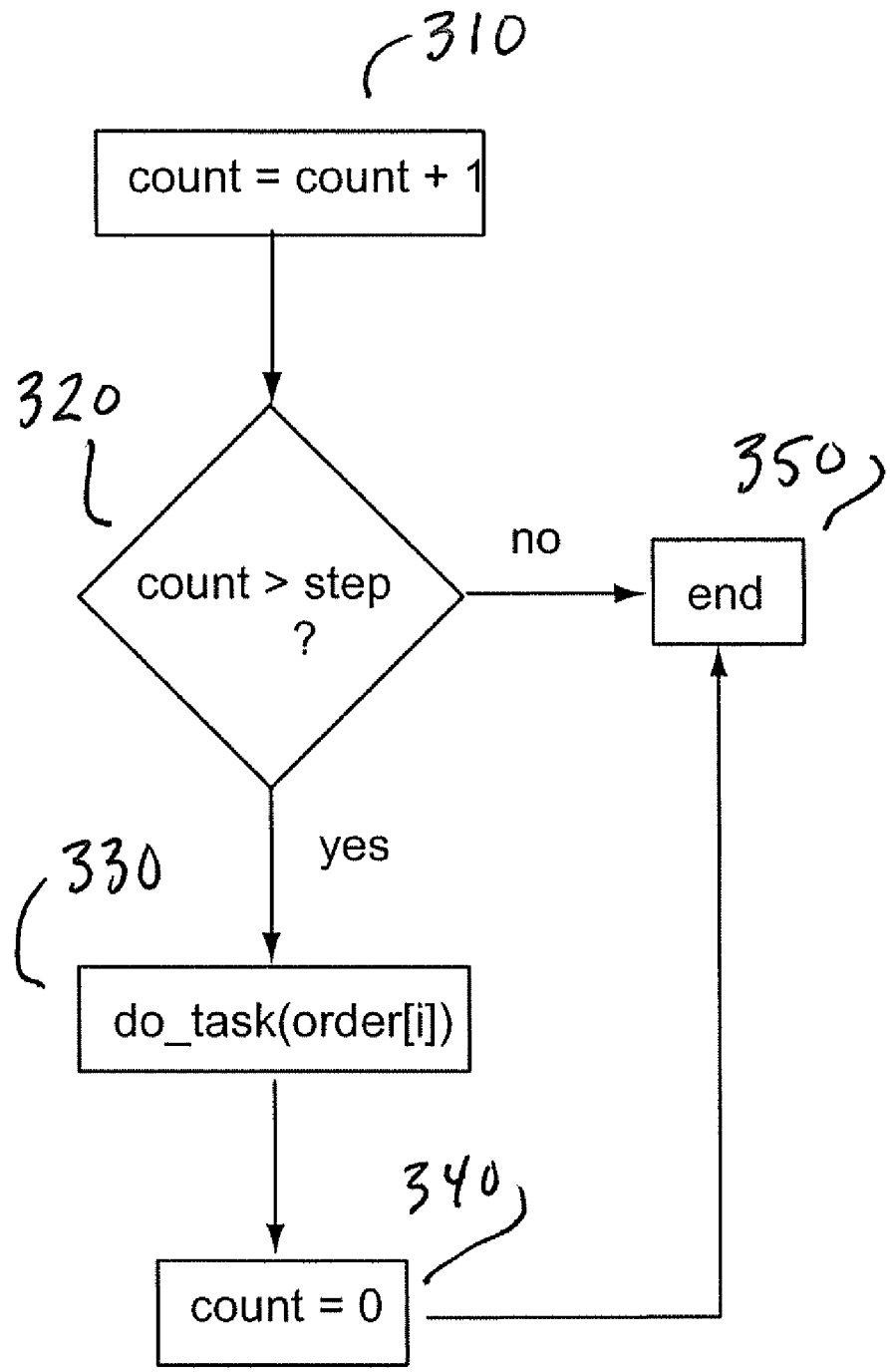
FIG. 3 illustrates interleaving objects and relations.
Figure 4:
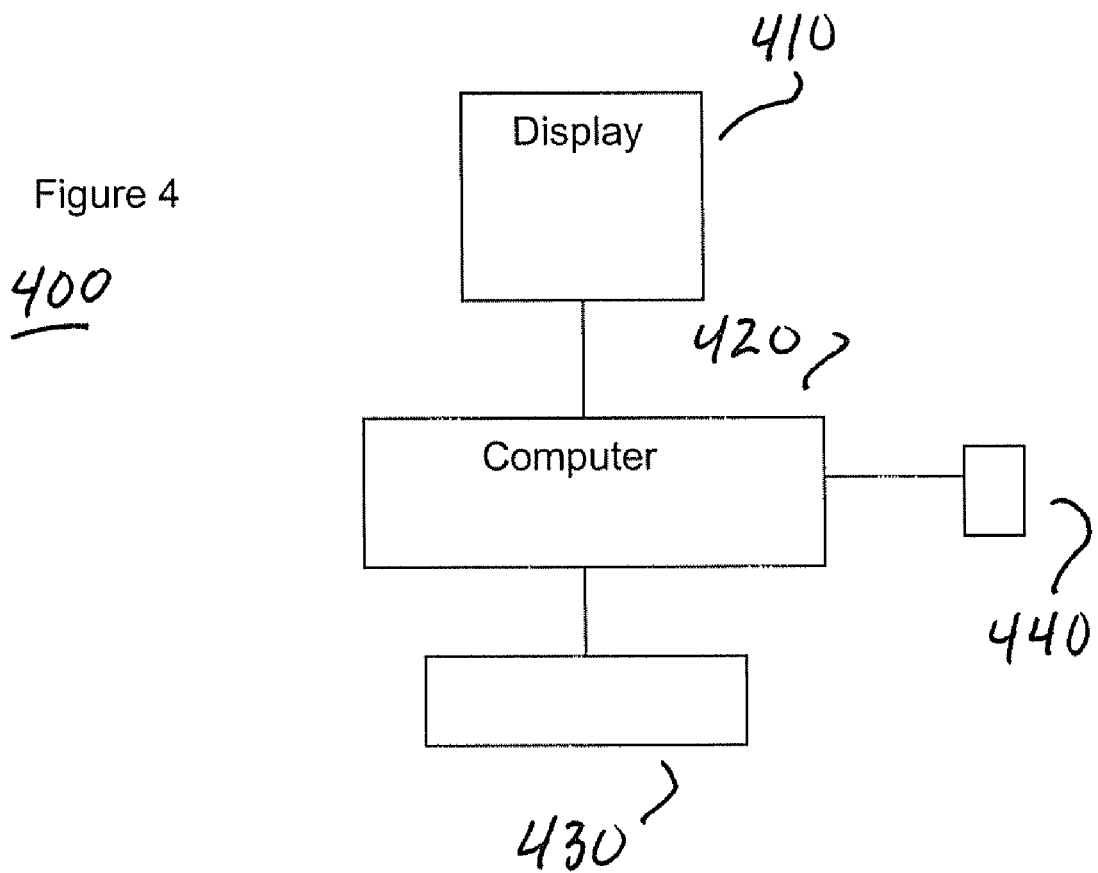
FIG. 4 depicts a system.

If the remainder r were zero you would simply call the object every step iterates. To ensure that all the objects get called at the last iteration you use a counter variable counter that is initially equal to −r. FIG. 3 shows the flowchart that corresponds to the process 300 that is in the iteration for each object. This process increments 310 a count, determines 320 whether the end 350 has been reached. If not, the task order is performed and the count is reset 340. It is again stressed that other interleaving schemes are possible. For example, each object could pick n_max_it random numbers between 1 and n_max_it_max.

As an example consider that the maximum number of iterations for objects A, B and C are 6, 4 and 2 respectively. Then the sequence of calls will be:

| Iteration: | | | | | |
|---|---|---|---|---|---|
| 1 | 2 | 3 | 4 | 5 | 6 |
| A | A | A | A | A | A |
|   |   | B |   | B | B |
|   |   |   | B |   |   |
|   |   | C |   |   | C |

FIG. 3 depicts a typical system 400 in which the processes discussed above can be included. The system 400 includes a display 410 for displaying the simulation being performed, a computer 420 that performs the processes and I/O devices such as a keyboard 430 and a mouse 440 for interacting with the processes.

The solver includes a data structure that assists in processing. The solver maintains two tables as shown below, the first containing the ordered sequence of order ids provided by the objects and the second table containing a list of pointers to the objects involved in the solver:

| Order_list[N] | Object_Pointers[M] |
|---|---|
| ord1 | Obj1 |
| ord2 | Obj2 |
| ord3 | Obj2 |
| ord4 | Obj4 |
| ... | ... |
| ordN | ObjM |

The system discussed herein also includes permanent or removable storage, such as magnetic and optical discs, RAM, ROM, etc. on which the process and data structures of the present invention can be stored and distributed. The processes can also be distributed via, for example, downloading over a network such as the Internet.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A solver method, comprising:
creating an ordered list of tasks involving objects and relationships between the objects to be simulated in a computer;
simulating, in the computer, the objects and relationships by traversing the list of tasks and passing the tasks to corresponding objects and relationships; and
repeating the traversing until a time for an end of the simulation is reached, wherein each object and relationship comprises operations of a pre-solving operation, pre-iteration operation, a solve operation, a post iteration operation and a post solve operation, each of the operations having tasks to be performed in an order and said creating comprises each object and relationship assigning an order number to each of the corresponding tasks.

2. A solver method, comprising:
creating an ordered list of tasks, comprising:
creating an ordered sequence of steps involving objects and relationships between the objects to be simulated in a computer;
querying the objects and relationships for tasks to be performed each having an order; and
merging the tasks into a sorted list responsive to the order;
simulating, in the computer, the objects and relationships by traversing the list and passing the tasks to corresponding objects and relationships with the objects and relationships treated as objects, where each object and relationship comprises operations of a pre-solving operation, pre-iteration operation, a solve operation, a post iteration operation and a post solve operation, each of the operations having tasks to be performed in an order and said creating comprises each object and relationship assigning an order number to each of the corresponding tasks, where each object has a least one constraint and said passing comprises having an object iterate on the constraint to find a solution, where each object has a constraint iteration maximum and where the traversing comprises interleaving object processing responsive to the constraint iteration maximum set for each object using a list of order identifiers and a corresponding list of pointers to objects; and
repeating the traversing until a time for an end of the simulation is reached.

* * * * *

UNITED STATES PATENT AND TRADEMARK OFFICE
CERTIFICATE OF CORRECTION

PATENT NO. : 7,933,858 B2  
APPLICATION NO. : 11/690152  
DATED : April 26, 2011  
INVENTOR(S) : Jos Stam Page 1 of 1

It is certified that error appears in the above-identified patent and that said Letters Patent is hereby corrected as shown below:

Column 7, Line 15 delete "Obj2" and insert -- Obj3 --, therefor.

Column 8, Line 31 in Claim 2, delete "a least" and insert -- at least --, therefor.

Signed and Sealed this  
Fifth Day of July, 2011

David J. Kappos  
*Director of the United States Patent and Trademark Office*